United States Patent [19]

Fromage et al.

[11] Patent Number: 4,779,561
[45] Date of Patent: Oct. 25, 1988

[54] CRUCIBLE FOR MULTI-BATH LIQUID PHASE EPITAXY

[75] Inventors: Francois Fromage, Cabourg; Marc Mahieu, Caen, both of France

[73] Assignee: U.S. Philips Corporation, New York, N.Y.

[21] Appl. No.: 27,779

[22] Filed: Mar. 19, 1987

[30] Foreign Application Priority Data

Mar. 21, 1986 [FR] France ................... 86 04080

[51] Int. Cl.⁴ .......................................... H01L 21/208
[52] U.S. Cl. ..................................... 118/412; 118/415; 118/421; 118/422
[58] Field of Search ............... 118/412, 421, 422, 415; 156/621, 622, 624

[56] References Cited

U.S. PATENT DOCUMENTS 4,160,682  7/1979  Esseluhn ..................... 118/415 X Primary Examiner—John P. McIntosh
Attorney, Agent, or Firm—Norman N. Spain

[57] ABSTRACT

The crucible is of the type in which substrates to be epitaxially coated are disposed in a slide comprising a substrate carrier (7), whose displacement permits of bringing the substrates (9) successively into contact with different baths of epitaxy. It comprises a compartment (2), in which tightening slides (11) and solution-containing slides (12) are alternately stacked, each of the latter slides having a cavity receiving a solution (14) and merging at the lower part of the said slide (12). The tightening slides (11) close the lower part of the cavities (45). The slide comprising a substrate carrier (7) can be translated between a rear position in which it is disengaged from the stack and a front position in which, after having driven out the lower slide of the stack, it is situated under this stack.

4 Claims, 4 Drawing Sheets

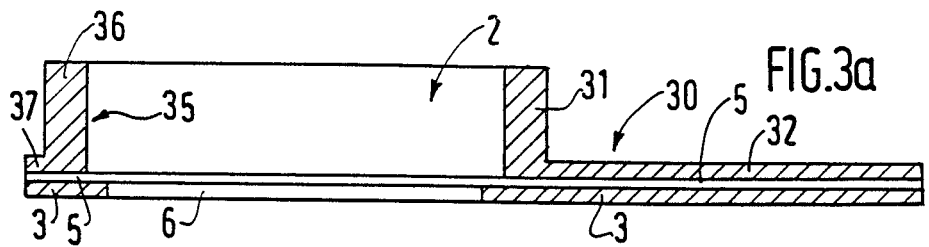
FIG.3a
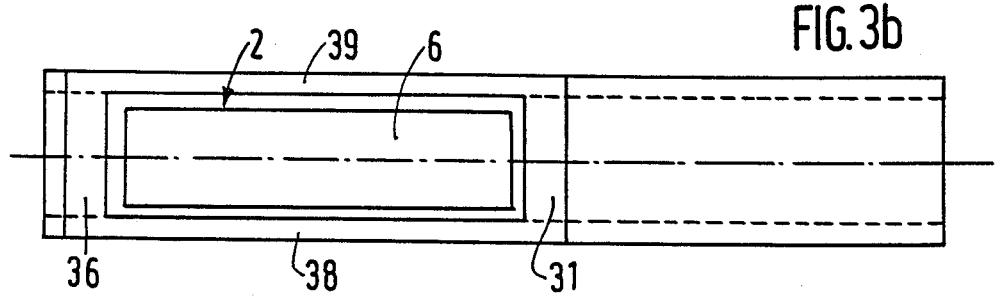
FIG.3b
FIG.4a
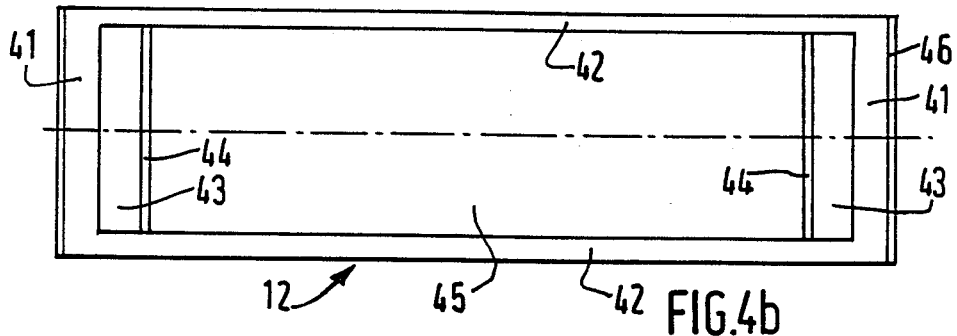
FIG.4b
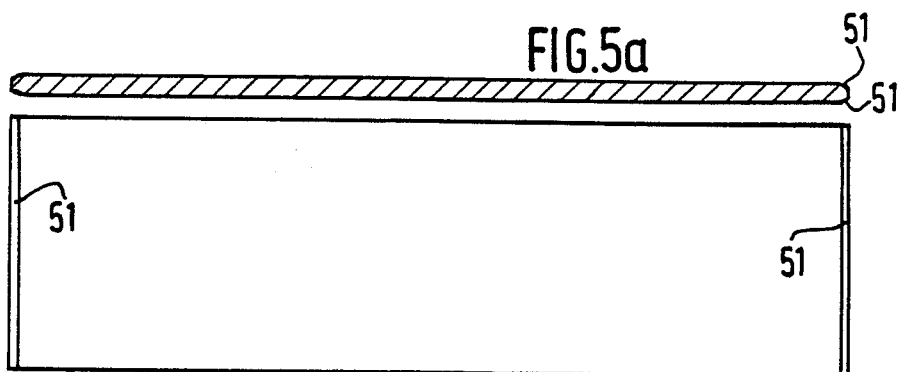
FIG.5a
FIG.5b

CRUCIBLE FOR MULTI-BATH LIQUID PHASE EPITAXY

BACKGROUND OF THE INVENTION

The invention relates to a crucible for carrying out a multi-bath liquid phase epitaxy process in which substrates to be epitaxially coated are disposed in a slide comprising a substrate carrier, whose displacement allows the bringing the substrates successively into contact with the different epitaxy baths.

Multi-bath crucibles are used frequently in industry. They allow the treating a large number of substrates the number of baths being limited, however, to two, or the treating a considerable smaller number of substrates in a larger number of baths.

For example, the crucible described in French Pat. No. 1,600,341 filed by the Applicant belongs to the first-mentioned category. It allows the epitaxially coating of a large number of substrates arranged horizontally. By translation of a slide comprising a substrate carrier, the latter is brought into contact with one or the other of two epitaxy baths. Thus, a two-layer or a multilayer epitaxy coating having only two types of alternate layers is thus obtained.

The crucible described in Japanese Patent Application published under No. 59-26997 (SUMITOMO) belongs to the last-mentioned category. The substrate carrier is not a single slide, but comprises three communicating and juxtaposed holding plates containing substrates to be epitaxially coated and brought by translation into contact successively with the different baths of epitaxy disposed in compartments spaced apart longitudinally. The wetting of the substrates contained in the three juxtaposed holding plates requires the application of a pressure. The use of such a crucible moreover involves difficulties because any solidification of the baths in the ducts providing for the mutual communication of the juxtaposed holding plates has to be avoided. Finally, it is not possible to treat with such a crucible a large number of substrates. An increase in the length of the holding plates leads in fact to a crucible having an unacceptable length. An increase in their width leads to difficulties during the translation of the holding plates. The crucibles are made of graphite and are therefore expensive and fragile.

SUMMARY OF THE INVENTION

The invention has for its object to provide a crucible whose design is adapted to the application of multi-bath epitaxies to a large number of substrates while in a simple manner.

The crucible according to the invention is characterized in that it comprises a compartment in which sealing slides and slides containing the baths are alernately stacked, each of the latter slides having a cavity adapted to receive an epitaxy bath and comprising a lower part merging with the lower surface of the bath-containing slide and the sealing slides being such that they close the lower part of the said cavities, and in that the slide comprising a substrate carrier can be translated in the same plane as the lowest slide of the stack of slides between a rear position in which it is disengaged from the stack and a front position in which, after having pushed the lowest slide from the stack, it is situated under the stack.

The displacement of the slide comprising a substrate carrier allows the substrates to be brought into contact with each of the different epitaxy baths. In fact, after the evacuation of a sealing slide by the slide comprising a substrate carrier, a bath-containing slide becomes the lowest slide of the stack of slides and the bath contained therein will wet the substrates of the slide comprising a substrate carrier situated under the stack of slides. According to a variation, the cavity of the bath-containing slides comprises at least one recess adapted to receive a solid phase for saturating the bath with at least one constituent.

BRIEF DESCRIPTION OF THE DRAWING

In the Drawing:

FIGS. 3a and 3b are a longitudinal sectional view and a plan view, respectively, of a crucible body according to the invention, FIGS. 4a and 4b are a longitudinal sectional view and a plan view, respectively, of a bath-containing slide according to the invention, FIGS. 5a and 5b are a longitudinal sectional view and a plan view, respectively, of a sealing slide according to the invention.

DETAILED DESCRIPTION OF THE INVENTION

According to a preferred embodiment, the compartment comprises a bottom having an opening provided at right angles to the stack so as to permit during the return of the slide comprising a substrate carrier to its rear position of evacuating the epitaxy baths used.

The tightening slide is advantageously a solid plate having the same outer contour as a solution-containing slide.

Figure 1A:
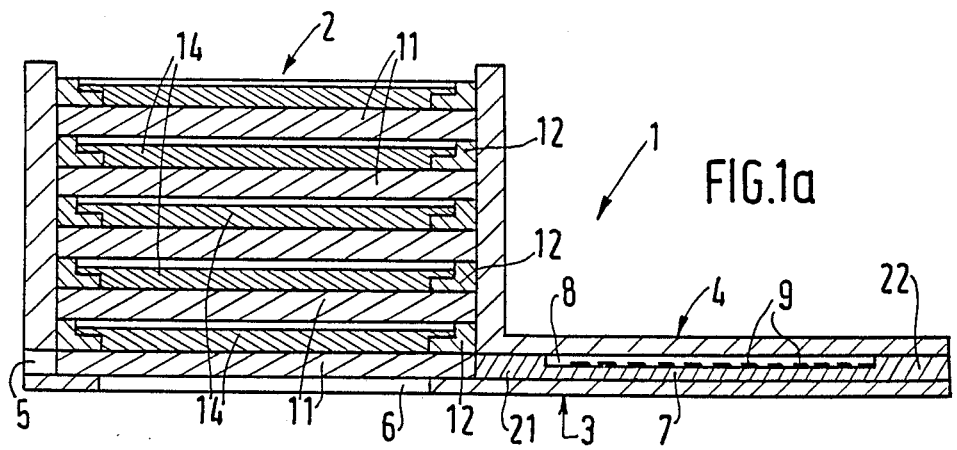
FIGS. 1a to 1e are longitudinal sectional views of a crucible according to the invention at different stages of illustrating an epitaxy with a bath of epitaxy.

In order that the invention may be readily carried out, it will now be described more fully, by way of example, with reference to the accompanying drawings, in which:

According to FIG. 1a, a crucible according to the invention comprises a crucible body designated by the general reference numeral 1 and composed of a compartment 2 and of a sliding surface 3 covered outside the compartment 2 by an upper edge 4 so as to define a sliding duct 5 of rectangular cross-section.

The compartment 2 is provided with a stack of alternately tightening slides 11 and bath-containing slides 12. When the crucible is positioned in a quartz bulb in order to carry out epitaxy operations, the lowest slide of the stack is a sealing slide 11 which is arranged at right angles to the duct 5.

The number of bath-containing slides 12 each filled with an epitaxy bath 14 is equal to the number of layers to be epitaxially coated. The substrates 9 to be epitaxially coated are arranged in a recess 8 of a slide 22 comprising a substrate carrier 7 which slide is situated in a rear position in the duct 5 under the upper edge 4.

It will be appreciated that the high viscosity of the baths of epitaxy permits of obtaining a good seal due to the simple clearance of the stack of slides. The bath-containing slides 12 are not closed at their lower part, that is to say that the baths 14 contained in these slides are held in these slides only by the presence of the sealing slides 11.

Figure 1B:
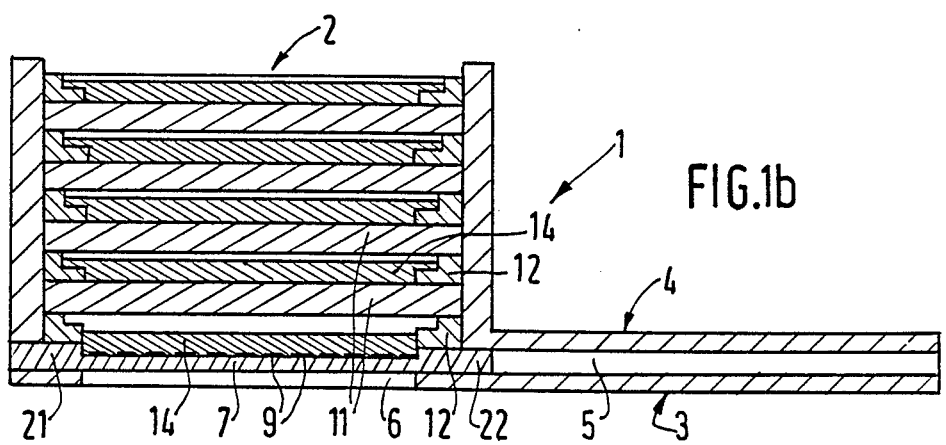

In FIG. 1b, the slide comprising a substrate carrier 7 has been translated along the sliding surface 3 so as to reach the front position under the stack of slides, its front part 21 having driven out the sealing slide 11 which was situated before at right angles to the duct 5. In this position, the substrates 9 are wetted by the bath 14 of the bath-containing slide 12 which comes to be situated at the base of the stack of slides 11 and 12.

Figure 1C:
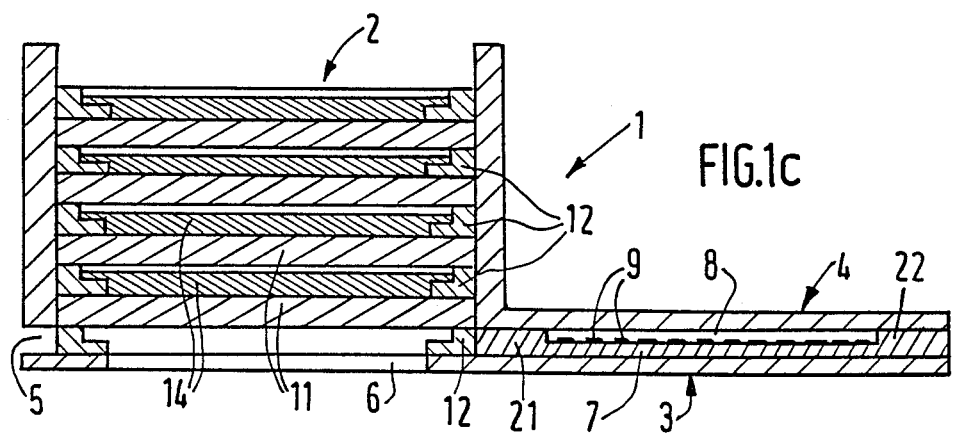

In FIG. 1c, after having carried out the desired epitaxy operation, the slide comprising a substrate carrier 7 has been taken to its rear position, which has had the effect on the one hand that the bath 14 having been used for the epitaxy operation is evacuated through an opening 6 of the sliding surface 3 to a receptacle not shown and on the other hand that the stack falls by half a step, the bath-containing slide from which its solution has been removed now being at right angles to the duct 5.

Figure 1D:
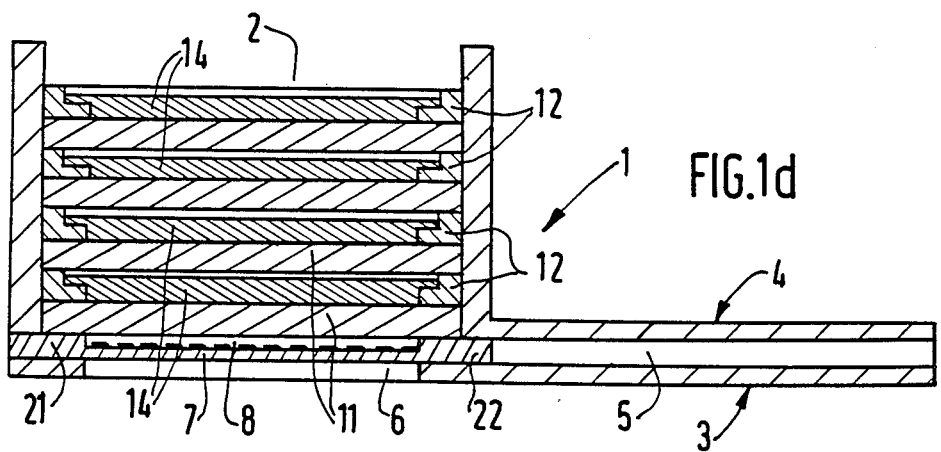

In FIG. 1d, the slide comprising a substrate carrier 7 has again been taken to its front position so that the bath-containing slide 12 used before is evacuated.

Figure 1E:
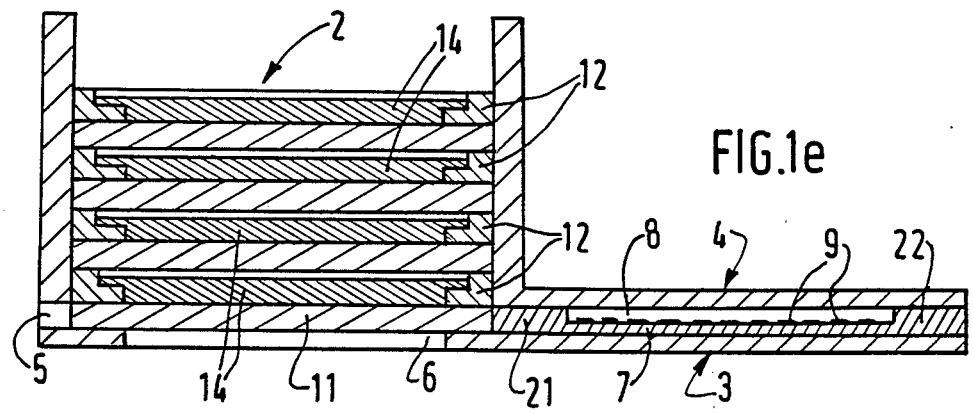

In FIG. 1e, the slide comprising a substrate carrier 7 has again been taken to its rear position. The stack falls again by half a step, a sealing slide 11 being situated at the lower part of the stack and at right angles to the duct 5. A situation equivalent to that of FIG. 1a is then obtained and the successive epitaxy operations can then be continued by moving in the manner described above the slide 7 comprising a substrate carrier between its rear position and its front position.

Figure 2A:
FIGS. 2a and 2b are a longitudinal sectional view and a plan view, respectively, of a slide comprising a substrate carrier according to the invention.
Figure 2B:
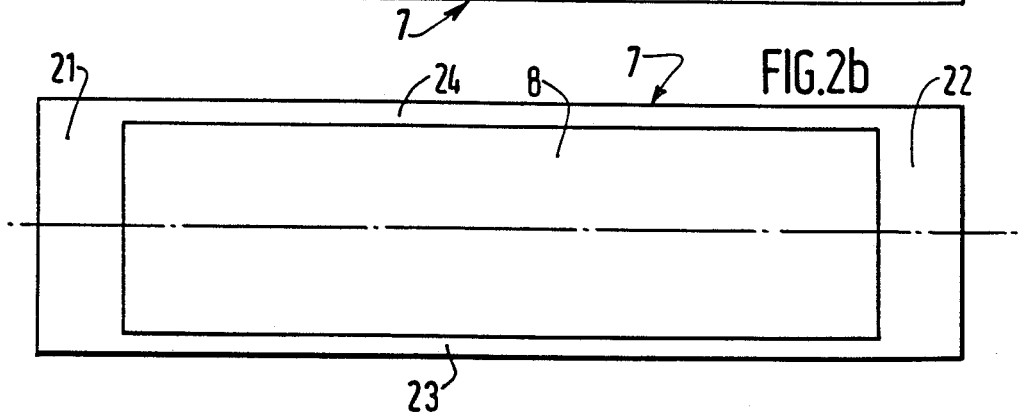

According to FIGS. 2a and 2b, the slide 7 comprising a substrate carrier has a recess 8, whose depth is equal to the height of the substrates 9 plus a small amount of clearance. This results in that during the return of the slide 7 comprising a substrate carrier to its rear position immediately after the deposition of an epitaxial layer, as between the steps of FIGS. 1b and 1c, the lower edge of the bath-containing slide 12 removes the major part of the bath. This permits of obtaining a high quality of the interface with the following epitaxial layer because of the low mixing rate between two successive solutions 14.

According to FIGS. 3a and 3b, the body of the crucible comprises a base plate 3, in which the opening 6 is provided and which has two longitudinal walls 38 and 39 of the compartment 2. Two closing elements 30 and 35 are mounted between the ends of the longitudinal walls 38 and 39 so as to form the two lateral walls 31 and 36 of the compartment 2 and to form due to extended parts 32 and 37, extending longitudinally along the walls 38 and 39 the upper parts of the duct 5 at the two sides of the duct.

According to FIGS. 4a and 4b, a bath-containing slide 12 has, except for the clearance, a general rectangular contour of the same cross-section as the compartment 2. It comprises two longitudinal walls 42 and two transverse walls 41. The transverse walls 41 are each extended towards the interior of the slide by an extended part 43 provided with an edge 44 so as to define a recess 40 adapted to receive a solid phase 48, for saturating the bath with at least one constituent. The bath 14 is contained in a cavity 45 bounded by the longitudinal walls 42 and the edge 44 and whose lower part merging at the lower surface 47 of the slide 12 is closed by a sealing slide 11 constituted by a single solid rectangular plate having the same dimensions as the slide 12 (FIGS. 5a and 5b).

It should be noted that the vertical displacement of the slides 11 and 12 is facilitated by the presence of bevelled parts 51 and 46, respectively, on their longitudinal walls.

Figure 6:
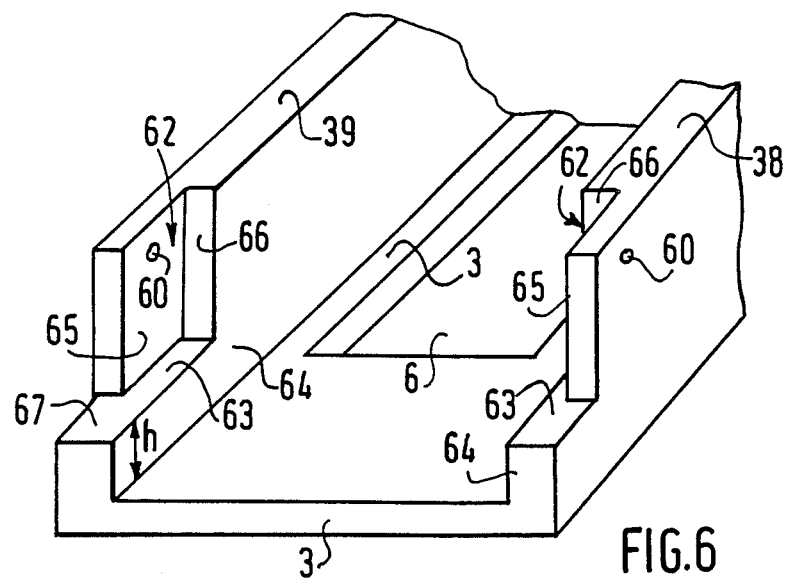
FIG. 6 is a perspective view of one end of the cricible body before mounting a closing element shown in perspective view in FIG. 7.
Figure 7:
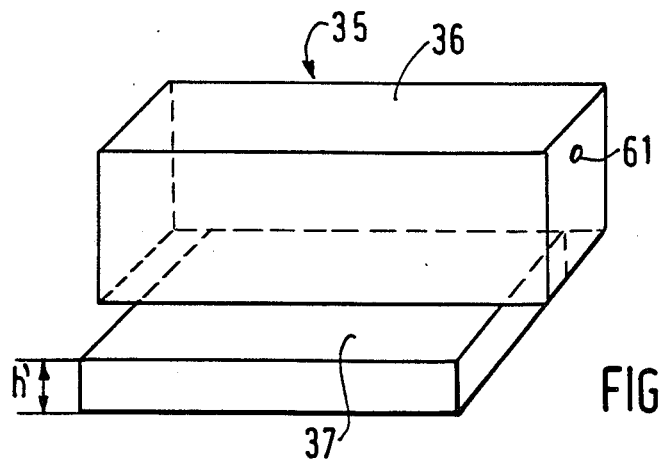

FIGS. 6 and 7 illustrate the operation of mounting the closing element 35. A similar mounting operation can be effected for the element 30, whose prolonged part 32 has a greater length because it has to be adapted to the length of the slide comprising a substrate carrier 7.

The closing element 35 comprises a block 36 constituting a lateral wall of the compartment 2 and overlying a prolonged part 37 having a smaller width, but extending beyond an end in such a manner that the duct 5 is covered with the prolonged part 37 beyond the perpendicular of the block 36 so as to receive the front end 21 of the slide comprising a substrate carrier 7.

The longitudinal walls 38 and 39 of the base plate 3 terminate with an end 62 of reduced thickness having a bore 60 and bounded by a vertical wall 66 forming a stop for the block 36, on which the block 36 bears. The height h' of the prolonged part 37 is smaller than the height h of an edge 64, whose longitudinal wall 63 and whose prolonged part 67 constitute the upper part. The difference h−h' is equal to the height of the duct 5, i.e. except for the clearance equal to the common height of the slides 11 and 12 and of the slide 7.

The invention is not limited to the embodiments described and illustrated. It is also possible to carry out in a different manner the evacuation of baths 14 by not providing the base plate 3 with the opening 6. In this case, the baths 14 are evacuated simultaneously with the bath-containing slides 12.

What is claimed is:

1. A crucible for carrying out a multi-bath liquid phase epitaxy process, in which substrates to be epitaxially coated are disposed in a slide comprising a substrate carrier, the displacement of which carrier allows bringing the substrates successively into contact with the different epitaxy baths, characterized in that said crucible comprises a compartment (2), in which sealing slides (11) and slides containing epitaxy baths (12) are alternately stacked, each of the latter slides (12) having a cavity (45) adapted to receive an epitaxy bath (14) and comprising a lower part merging with the lower surface (47) of said bath-containing slide (12), the sealing slides (11) being such that they seal the lower part of the said cavities (45), and in that the slide comprising a substrate carrier (7) can be translated in the same plane as the lowest slide of the stack of slides between a rear position in which it is disengaged from the stack and a front position in which, after having pushed out the lowest slide of the stack, it is situated under the stack.

2. A crucible as claimed in claim 1, characterized in that the cavity (45) of at least one of the bath-containing slides (12) is provided with at least one recess (40) adapted to receive a solid phase (48) for saturating said bath with at least one constituent.

3. A crucible as claimed in any one of claims 1 or 2, characterized in that the compartment (2) has a bottom (3) having an opening (6) situated at right angles to the stack so as to allow the evacuation of the epitaxy baths (14) used during the return of the slide comprising a substrate carrier (7) to its rear position.

4. A crucible as claimed in claim 1, characterized in that a sealing slide (11) consists of a solid plate having the same outer contour as an epitaxy bath-containing slide (12).

* * * * *